United States Patent
Lee et al.

(10) Patent No.: US 12,468,222 B2
(45) Date of Patent: Nov. 11, 2025

(54) METHOD FOR SELECTIVE SEPARATION AND TRANSFER OF TWO-DIMENSIONAL MATERIAL AND METHOD OF FABRICATING DEVICE USING THE SAME

(71) Applicant: Seoul National University R&DB foundation, Seoul (KR)

(72) Inventors: Yun Seog Lee, Seoul (KR); Ki-Tae Park, Gyeongsangnam-do (KR); Sunggun Yoon, Seoul (KR); Young Ho Chu, Gyeonggi-do (KR)

(73) Assignee: Seoul National University R&DB foundation, Seoul (KR)

( * ) Notice: Subject to any disclaimer, the term of this patent is extended or adjusted under 35 U.S.C. 154(b) by 432 days.

(21) Appl. No.: 18/113,113

(22) Filed: Feb. 23, 2023

(65) Prior Publication Data

US 2023/0266663 A1     Aug. 24, 2023

(30) Foreign Application Priority Data

Feb. 23, 2022   (KR) .......................... 10-2022-0023946
Feb. 22, 2023   (KR) .......................... 10-2023-0023885

(51) Int. Cl.
*G03F 7/00*      (2006.01)

(52) U.S. Cl.
CPC ................... *G03F 7/0002* (2013.01)

(58) Field of Classification Search
None
See application file for complete search history.

(56) References Cited

U.S. PATENT DOCUMENTS

2015/0336800 A1   11/2015   Bedell et al.

FOREIGN PATENT DOCUMENTS

| JP | 2014-525134 | 9/2014 |
| KR | 10-2023-0010181 | 1/2023 |

OTHER PUBLICATIONS

Kang et al., Fabrication of flexible optoelectronic devices based on MoS2/graphene, Carbon 116 (2017) 167-173.*
Adam J. Watson et al., "Transfer of large-scale two-dimensional semiconductors: challenges and developments", 2D Mater. 8 (2021) 032001, May 3, 2021.

* cited by examiner

*Primary Examiner* — James M Mellott

(57) ABSTRACT

A disclosed method of selective separation and transfer of 2D material may include preparing a substrate structure including an adhesion target layer in which at least two different material layers are arranged to be in contact with each other laterally, preparing a crystalline material member including a 2D material, wherein the 2D material constitutes a unit layer, and a plurality of the unit layers form a layered structure through bonding, adhering the crystalline material member to a surface of the adhesion target layer so that a bond is formed between the crystalline material member and the adhesion target layer, and separating the crystalline material member and the adhesion target layer so that a 2D material layer pattern separated from the crystalline material member is formed on the surface of the adhesion target layer.

20 Claims, 14 Drawing Sheets

METHOD FOR SELECTIVE SEPARATION AND TRANSFER OF TWO-DIMENSIONAL MATERIAL AND METHOD OF FABRICATING DEVICE USING THE SAME

CROSS-REFERENCE TO RELATED APPLICATION

This application claims priority of Korean Patent Application No. 10-2022-0023946, filed on Feb. 23, 2022, and priority of Korean Patent Application No. 10-2023-0023885, filed on Feb. 22, 2023, in the KIPO (Korean Intellectual Property Office), the disclosure of which is incorporated herein entirely by reference.

BACKGROUND OF THE INVENTION

Field of the Invention

The present invention relates to a method for forming a material layer and its application, and more particularly, to a method for forming a 2D material layer pattern and a method of fabricating a device using the same.

Description of the Related Art

As a 2D material (two-dimensional material) is a single-layer or half-layer solid in which atoms form a predetermined crystal structure, and may exhibit excellent electrical/optical/mechanical properties. Graphene is a representative 2D material, and while starting with research on graphene, research and development on various 2D materials having semiconductor properties or insulating properties have been conducted. The 2D materials are attracting attention as a next-generation material which may overcome the limitations of existing devices.

Because of this reason, research and development for applying 2D materials to various devices are being actively conducted. However, in applying a 2D material to a device, various technical problems exist, and it may be difficult to secure excellent characteristics/performance. In particular, in forming and patterning a 2D material, it may not be easy to handle the 2D material, and it may not be easy to control a shape, a position, and a thickness of the 2D material, and there are technical problems and difficulties that 2D materials may be damaged or contaminated.

The above-described information disclosed in the background description is provided only for improving the understanding of the background of the present disclosure, and thus may include the information which does not constitute the prior art.

SUMMARY OF THE INVENTION

The technical object to be achieved by the present invention is to provide a 'method of selective separation and transfer of a 2D material' which may easily form a 2D material layer pattern while minimizing the effect on the physical/chemical properties of the 2D material without problems such as damage, contamination, residue generation, and etc. to the 2D material.

In addition, the technical object to be achieved by the present invention is to provide a "method of selective separation and transfer of a 2D material' capable of precisely patterning a 2D material and easily controlling a shape, a position, a thickness, and etc. of the 2D material pattern.

In addition, a technical object to be achieved by the present invention is to provide a "method of selective separation and transfer of a 2D material' which may be easily applied even to 2D materials vulnerable to exposure to external environments and chemicals.

In addition, a technical object to be achieved by the present invention is to provide a method of manufacturing a device to which the method of selective separation and transfer of a 2D material described above is applied.

The object to be achieved by the present invention is not limited to the objects mentioned above, and other objects not mentioned will be understood by those skilled in the art from the description below.

According to one embodiment of the present invention, there is provided a method of selective separation and transfer of a 2D material, comprising: preparing a substrate structure including an adhesion target layer in which at least two different material layers are arranged to be in contact with each other laterally; preparing a crystalline material member including a 2D material, wherein the 2D material constitutes a unit layer, and a plurality of the unit layers form a layered structure through bonding; adhering the crystalline material member to a surface of the adhesion target layer so that a bond is formed between the crystalline material member and the adhesion target layer; and separating the crystalline material member and the adhesion target layer so that a 2D material layer pattern separated from the crystalline material member is formed on the surface of the adhesion target layer; and wherein a shape of the 2D material layer pattern is defined by the at least two material layers.

The preparing the substrate structure may include forming the adhesion target layer having a desired pattern shape on a base substrate; forming a supporting layer on the adhesion target layer; forming a handling layer on the supporting layer; and separating a stack structure including the adhesion target layer, the supporting layer, and the handling layer from the base substrate.

The at least two material layers may include a first material layer and a second material layer, a bonding force between the first material layer and the 2D material may be greater than a bonding force between the plurality of unit layers, a bonding force between the second material layer and the 2D material may be smaller than the bonding force between the plurality of unit layers, and the 2D material layer pattern may be formed on the first material layer instead of the second material layer.

The at least two material layers may include a first material layer and a second material layer, and the first material layer and the second material layer may have different surface roughness.

The at least two material layers may include a first material layer and a second material layer, the first material layer may be any one of a conductor, a semiconductor and an insulator, and the second material layer may be any one of a conductor, a semiconductor and an insulator.

The method may further include transferring the 2D material layer pattern formed on the surface of the adhesion target layer to a separate adhesion target substrate from the adhesion target layer. A bonding force between the adhesion target substrate and the 2D material may be greater than a bonding force between the adhesion target layer and the 2D material.

The at least two material layers may include a first material layer, a second material layer disposed on each of both sides of the first material layer, and a third material layer disposed around at least the second material layer. The 2D material layer pattern may be formed on the first and second material layers instead of the third material layer.

The first material layer may be a first insulator, the second material layer may be a conductor, and the third material layer may be a second insulator.

The 2D material layer pattern may be a channel layer pattern interconnecting the two second material layers disposed on both sides of the first material layer.

The 2D material may include, for example, any one of a 2D perovskite material and a transition metal dichalcogenide (TMD) material.

According to another embodiment of the present invention, there is provided a method for selective separation and transfer of a 2D material, comprising: preparing a substrate structure including an adhesion target layer in which at least two different material layers are arranged to be in contact with each other laterally; preparing a crystalline material member including a 2D material, wherein the 2D material constitutes a unit layer, and a plurality of the unit layers form a layered structure through bonding; adhering the crystalline material member to a surface of the adhesion target layer so that a bond is formed between the crystalline material member and the adhesion target layer; separating the crystalline material member and the adhesion target layer so that the 2D material layer separated from the crystalline material member remains on the surface of the adhesion target layer; adhering the 2D material layer disposed on the surface of the adhesion target layer to a surface of the adhesion target substrate; and separating the adhesion target layer and the adhesion target substrate so that a 2D material layer pattern separated from the 2D material layer in a pattern form remains on the surface of the adhesion target substrate; and wherein a shape of the 2D material layer pattern is defined by the at least two material layers and the adhesion target substrate.

The at least two material layers may include a first material layer and a second material layer, a bonding force between the first material layer and the 2D material may be greater than a bonding force between the plurality of unit layers, a bonding force between the second material layer and the 2D material may be greater than the bonding force between the plurality of unit layers, and the 2D material layer may remain on the first and second material layers.

The bonding force between the first material layer and the 2D material may be greater than a bonding force between the adhesion target substrate and the 2D material, and the bonding force between the second material layer and the 2D material may be smaller than the bonding force between the adhesion target substrate and the adhesion target substrate. The bonding force between the 2D materials may be smaller, and the 2D material layer pattern may remain on a region corresponding to the second material layer on the adhesion target substrate.

The at least two material layers may include first material layer and the second material layer, and the first material layer and second material layer may have different surface roughness.

According to another embodiment of the present invention, there is provided a method for selective separation and transfer of a 2D material, comprising: preparing a substrate structure including an adhesion target layer in which at least two different material layers are arranged to be in contact with each other laterally; preparing a crystalline material member including a 2D material, wherein the 2D material constitutes a unit layer, and a plurality of the unit layers form a layered structure through bonding; adhering the crystalline material member to a surface of the adhesion target layer so that a bond is formed between the crystalline material member and the adhesion target layer; and separating the crystalline material member and the adhesion target layer so that the 2D material layer separated from the crystalline material member remains on the surface of the adhesion target layer; and wherein the 2D material layer has a different thickness on the at least two material layers.

The at least two material layers may include a first material layer and a second material layer, and the 2D material layer includes a first portion disposed on the first material layer and a second portion disposed on the second material layer. The first portion may have a first thickness, and the second portion may have a second thickness different from the first thickness.

The at least two material layers may further include a third material layer, the 2D material layer may further include a third portion disposed on the third material layer, and the third portion may have a third thickness different from the first and second thicknesses.

The at least two material layers may include a first material layer and a second material layer, and the first material layer and second material layer may have different surface roughness.

According to another embodiment of the present invention, a method of fabricating a device to which a 2D material is applied is provided and the method comprises: forming a 2D material layer pattern by using the above method; and forming a device including the 2D material layer pattern.

The device may include any one of a semiconductor device, a display device, a solar cell device, and a sensor device.

According to the embodiments of the present invention, a 'method of selective separation and transfer of a 2D material' capable of easily forming a material layer pattern may be implemented while minimizing the effect on the physical/chemical properties of 2D materials without problems such as damage, contamination, or residue generation for the 2D materials by using the difference in bonding force between materials. In addition, according to embodiments of the present invention, a 'method of selective separation and transfer of a 2D material' capable of precisely patterning a 2D material and easily controlling a shape, a position, a thickness, and etc. of the 2D material pattern may be implemented. In addition, according to the embodiments of the present invention, it is possible to implement a 'method of selective separation and transfer of a 2D material' which may be easily applied even to 2D materials vulnerable to exposure to external environments and chemicals due to the characteristics of a dry process.

According to embodiments of the present invention, since the bonding force between materials may be controlled in a wide range by controlling the material composition and surface roughness of an adhesion target layer according to a region, the application scope of the above 'method of selective separation and transfer of a 2D material' may be expanded to various 2D materials.

When using the method of selective separation and transfer of a 2D material according to embodiments of the present invention, various devices having excellent performance may be easily manufactured. In addition, according to one embodiment, since various materials and manufacturing methods may be applied to the adhesion target layer and the supporting layer, there is an advantage that the result of above selective separation and transfer may be directly applied to the manufacture of thin film devices by applying materials and structures constituting the thin film device to the adhesion target layer and the supporting layer.

However, the effects of the present invention are not limited to the above effects, and may be variously extended without departing from the technical spirit and scope of the present invention.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1A:
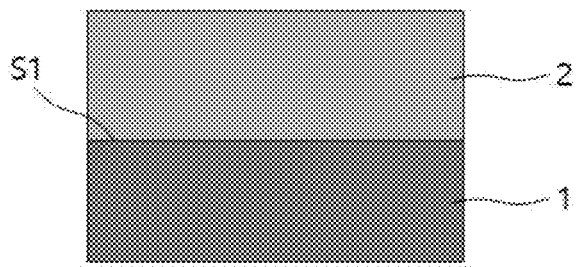
FIG. 1A to FIG. 1G are cross-sectional diagrams illustrating a method of forming a substrate structure applicable to a selective separation and transfer method of a 2D material according to an embodiment of the present invention.

Hereinafter, a preferred embodiment of the present disclosure will be elucidated in detail with reference to the accompanying drawings.

The embodiments of the present disclosure are provided for more completely explaining the present disclosure to those skilled in the art, the below embodiments can be modified to various forms and the scope of the present disclosure is not limited to the below embodiments. These embodiments are rather provided for more faithfully and completely explaining the present disclosure and for completely conveying the spirit of the present disclosure to those skilled in the art.

In the drawings, in addition, the dimension or thickness of each layer is exaggerated for clarity and convenience of the description and the same reference numeral indicates the same structural element. As used in the detail description, the term "and/or" includes any one of the listed items and one or more combination thereof. In addition, the term "connect" in the detail description means the state in which A member is directly connected to B member as well as the state in which C member disposed between A member and B member so that A member is indirectly connected to B member via C member.

The terms used herein are employed for describing the specific embodiment and the present disclosure is not limited thereto. As used in the detailed description and the appended claims, the singular forms may include the plural forms as well, unless the context clearly indicates otherwise. In addition, the terms "comprises" and/or "comprising" or "includes" and/or "including" used in the detailed description specify the presence of stated features, regions, integers, steps, operations, elements, and/or components, but do not preclude the presence or addition of one or more other features, regions, integers, steps, operations, elements, components, and/or groups thereof.

Although the terms of "first", "second", etc. are used herein to describe various members, parts, regions, layers and/or sections, it is obvious that these members, parts, regions, layers and/or sections should not be limited by the above terms. These terms are employed only for distinguishing one member, part, region, layer or section from another region, layer or section. Thus, the first member, the first part, the first region, the first layer or the first section described below may refer to the second member, the second part, the second region, the second layer or section without departing from the teachings of the present disclosure.

Furthermore, the terms related to a space such as "beneath", "below", "lower", "above" and "upper" may be used to easily understand one element or a characteristic or another element or a characteristic illustrated in the drawings. The above terms related to the space are employed for easy understanding of the present disclosure depending on various process states or usage states of the present disclosure, and are not intended to limit the present disclosure.

FIG. 1A to FIG. 1G are cross-sectional diagrams illustrating a method for forming a substrate structure applicable to a selective separation and transfer method of a 2D material according to an embodiment of the present invention. A selective separation and transfer method of a 2D material according to an embodiment of the present invention may include preparing a substrate structure including an adhesion target layer in which at least two different material layers are arranged to be in a lateral contact with each other. The substrate structure may be formed, for example, by a method described in FIGS. 1A to 1G.

Referring to FIG. 1A, a photoresist film 2 may be formed on a base substrate 1. An upper surface of the base substrate 1 may be a reference surface S1, and the photoresist layer 2 may be formed on the reference surface S1. The base substrate 1 may be, for example, a semiconductor substrate, an insulator substrate, or a conductor substrate. As a specific example, the base substrate 1 may be a silicon (Si) substrate, but the material of the base substrate 1 may be variously changed. The reference surface S1 may have, for example, a surface roughness ranging from several Å to several tens of Å. As an example, a Si wafer having a surface roughness of Å level through a chemical mechanical polishing (CMP) process may be used as the base substrate 1, but an embodiment of the present disclosure is not limited thereto.

Figure 1B:
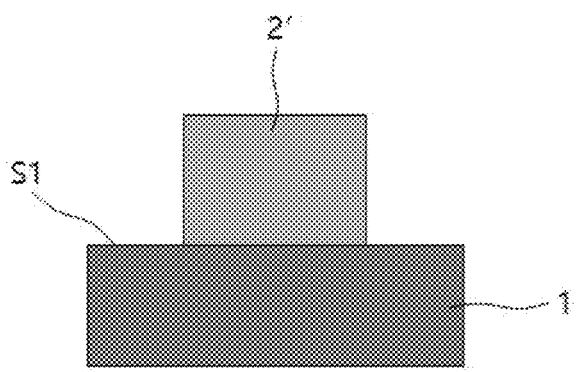

Referring to FIG. 1B, a photoresist pattern 2' may be formed by removing a portion of the photoresist layer 2 through an exposure process and a development process on the photoresist layer 2. As for the exposure process, for example, ultraviolet (UV ray) may be used, but light of a band other than ultraviolet may be used. The reference surface S1 may be exposed around the photoresist pattern 2'.

Figure 1C:
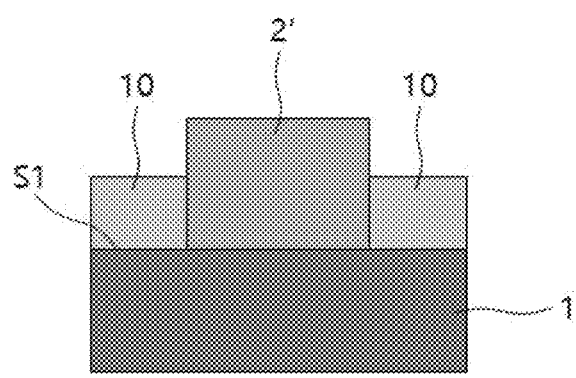

Referring to FIG. 1C, a first material layer 10 may be deposited on the reference surface S1 exposed around the photoresist pattern 2'. Surface roughness of a surface of the first material layer 10 in contact with the reference surface S1 may be adjusted according to the type of the first material layer 10 and deposition conditions.

Figure 1D:
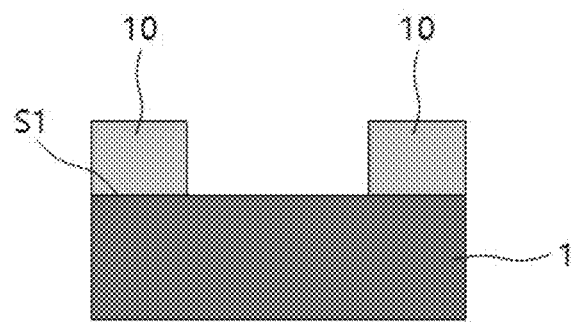

Referring to FIG. 1D, the photoresist pattern 2' may be removed by using a lift-off process or the like. As a result, the reference surface S1 around the first material layer 10 may be exposed.

Figure 1E:
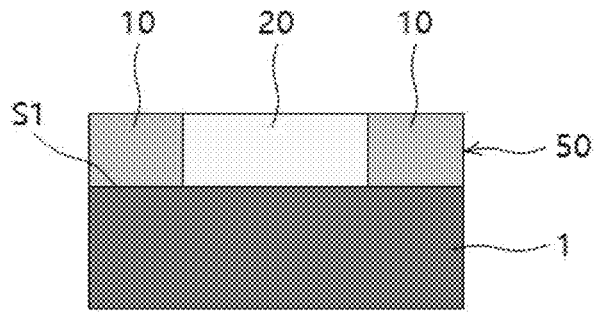

Referring to FIG. 1E, a second material layer 20 may be deposited on the reference surface S1 exposed around the first material layer 10. The second material layer 20 may be formed by a material different from that of the first material layer 10. Surface roughness of a surface of the second material layer 20 contacting the reference surface S1 may be adjusted according to the type of the second material layer 20 and the deposition conditions.

An adhesion target layer 50 in which at least two different material layers 10 and 20 are arranged to be in contact with each other laterally may be formed on the base substrate 1. A side surface of the second material layer 20 may be in contact with a side surface of the first material layer 10. According to an embodiment, the first material layer 10 may be disposed on both sides of the second material layer 20. The first material layer 10 may be in contact with both side surfaces of the second material layer 20. The second material layer 20 may have a thickness which is same as that of the first material layer 10, but may have a thickness different from that of the first material layer 10 in some cases. In addition, the second material layer 20 may have an extended shape to cover at least a portion of an upper surface of the first material layer 10.

The number of material layers constituting the adhesion target layer 50 may be increased to three or more by repeatedly performing the exposure and development of the photoresist film 2 and the deposition process of the material layer described in FIGS. 1A to 1E. The exposure and development of the photoresist film 2 and the deposition process of the material layer described in FIGS. 1A to 1E may be regarded as examples of a lithography process. Accordingly, the adhesion target layer 50 may be referred to as a layer formed by applying a lithography process. The lithography process may be, for example, a photolithography process. However, the adhesion target layer 50 having a desired pattern shape may also be formed by other methods other than lithography.

According to an embodiment, the first material layer 10 may be any one of a conductor, a semiconductor and an insulator, and the second material layer 20 may be another one of a conductor, a semiconductor and an insulator. The conductor may include, but is not limited to, a metal such as Ni, Au, Ag, Pd, or Cu or a metal compound. The semiconductor may include, but is not limited to, oxide-based semiconductor materials such as Mo oxide (e.g., $MoO_3$), Ni oxide (e.g., NiO), Sn oxide (e.g., $SnO_2$), Ti oxide (e.g., $TiO_2$), or a non-oxide semiconductor material. The insulator includes, but is not limited to, an insulating oxide such as Al oxide (e.g., $Al_2O_3$), Si oxide (e.g., $SiO_2$) or an insulating fluoride such as Mg fluoride (e.g., $MgF_2$), or other insulating material. When the adhesion target layer 50 further includes a third material layer, the third material layer may be any one of a conductor, a semiconductor, and an insulator.

According to another embodiment, the first material layer 10 may be a first conductor, and the second material layer 20 may be a second conductor different from the first conductor. Alternatively, the first material layer 10 may be a first semiconductor, and the second material layer 20 may be a second semiconductor different from the first semiconductor. Alternatively, the first material layer 10 may be a first insulator, and the second material layer 20 may be a second insulator different from the first insulator.

Since the first and second material layers 10 and 20 may by formed of various materials, it may be easy to apply the adhesion target layer 50 to various devices later, if necessary.

Figure 1F:
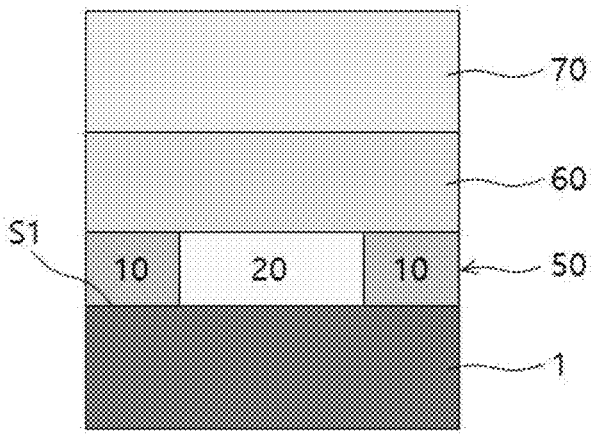

Referring to FIG. 1F, a supporting layer 60 may be formed on the adhesion target layer 50. The supporting layer 60 may be formed by, for example, a metal such as Ni, or a metal compound, or a predetermined insulator or semiconductor and so on, as the non-limiting examples. The supporting layer 60 may be formed to a thickness of, for example, several μm to several hundred μm. The supporting layer 60 may be formed through a deposition process. Next, a handling layer 70 may be formed on the supporting layer 60. The handling layer 70 may include, for example, a polymer or be a polymer layer. The handling layer 70 may be formed in a manner that it is attached to the supporting layer 60. The handling layer 70 may have, for example, a thickness of several hundred μm or more.

Figure 1G:
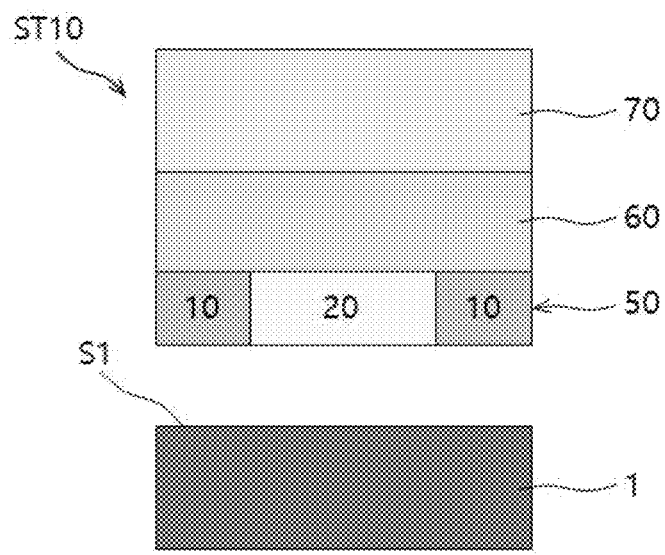

Referring to FIG. 1G, the stack structure ST10 including the adhesion target layer 50, the supporting layer 60, and the handling layer 70 may be separated from the base substrate 1. The adhesion target layer 50 may be separated from the reference surface S1 by applying an external force to the stack structure ST10 through the handling layer 70. The handling layer 70 may be a layer for handling the stack structure ST10 in the above-described separation process and subsequent processes. The supporting layer 60 may be a layer which facilitates separation of the adhesion target layer 50 in the above separation process. A separation process of the adhesion target layer 50 may be optimized by adjusting the material type, deposition conditions, and thickness conditions of the supporting layer 60. By using an appropriate supporting layer 60, when separating the adhesion target layer 50 from the reference surface S1, the problem that the surface of the bonding target layer 50 is damaged by the complex stress generated during the separation process may be prevented or minimized. The exposed surfaces of the first and second material layers 10 and 20 may have a surface roughness ranging from several Å to several tens of Å. Also, the first and second material layers 10 and 20 may have different surface roughness. In one embodiment of the present invention, it is possible to control the surface roughness of the bonding target layer 50 formed thereon through surface treatment of the base substrate 1. Furthermore, the surface roughness of the corresponding material layers 10 and 20 may be controlled by controlling the deposition process of the material layers 10 and 20, but this method may be variously changed.

The stack structure ST10 may be referred to as a substrate structure including the adhesion target layer 50 in which at least two different material layers 10 and 20 are arranged to be in contact with each other laterally. Hereinafter, the stack structure ST10 will be referred to as a substrate structure ST10. The substrate structure ST10 may include the adhesion target layer 50, the supporting layer 60, and the handling layer 70. However, in some cases, the configuration of the substrate structure ST10 may be variously changed.

FIG. 2A to FIG. 2F are cross-sectional diagrams illustrating a selective separation and transfer method of a 2D material according to an embodiment of the present invention.

Figure 2A:
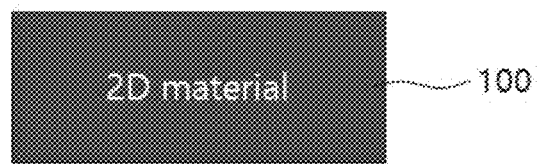
FIG. 2A to FIG. 2F are cross-sectional diagrams illustrating a selective separation and transfer method of a 2D material according to an embodiment of the present invention.

Referring to FIG. 2A, a substrate structure ST10 including an adhesion target layer 50 in which at least two different material layers 10 and 20 are arranged with laterally and mutually contacting may be provided. Although the substrate structure ST10 is briefly illustrated in FIG. 2A, the substrate structure ST10 may have the structure described in FIG. 1G. Accordingly, in FIG. 2A, a supporting layer (60 in FIG. 1G) may be provided below the adhesion target layer 50, and a handling layer (70 in FIG. 1G) disposed under the supporting layer may be further provided.

A crystalline material member 100 comprising a 2D material, wherein the 2D material constitutes a unit layer, and a plurality of the unit layers form a layered structure by van der Waals (vdW) bonding may be provided. Here, the layer structure may be parallel to an upper surface and a lower surface of the crystalline material member 100. The plurality of unit layers may be stacked in a thickness direction of the crystalline material member 100. The crystalline material member 100 may be a bulk member or a thin film. When the crystalline material member 100 is a thin film, the crystalline material member 100 may be attached to a separate handling substrate (not shown). In the drawing, in order to flatten or clean the lower surface of the crystalline material member 100, a process to peel off the outermost unit layer (or two or more unit layers) of the lower portion of the crystalline material member 100 may be performed in advance. Through such a process, the lower surface of the crystalline material member 100 may have a surface roughness similar to that of the reference surface S1 described in FIG. 1A.

Figure 2B:
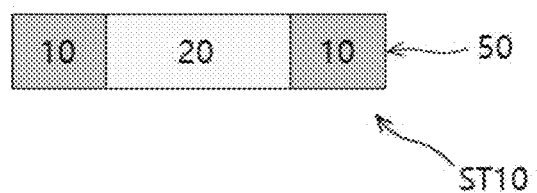

Referring to FIG. 2B, the crystalline material member 100 may be adhered to the surface of the adhesion target layer 50 so that a bonding may be formed between the crystalline material member 100 and the adhesion target layer 50. In other words, the surface of the crystalline material member 100 may be attached to the surface of the target layer 50 so that a bonding may be formed between the 2D material (a unit layer) of the crystalline material member 100 and the adhesion target layer 50. In this case, an appropriate pressure may be applied to at least one of the crystalline material member 100 and the adhesion target layer 50 so that an intimate interface may be formed between the crystalline material member 100 and the adhesion target layer 50. In addition, if necessary, a method for heating the interface or forming a vacuum state may be applied to remove foreign substances that may be collected on the interface or to prevent the collection of foreign substances. As a result of the process of FIG. 2B, a bonding may be formed between the first material layer 10 and the 2D material, and a van der Waals bonding may be formed between the second material layer 20 and the 2D material.

Figure 2C:
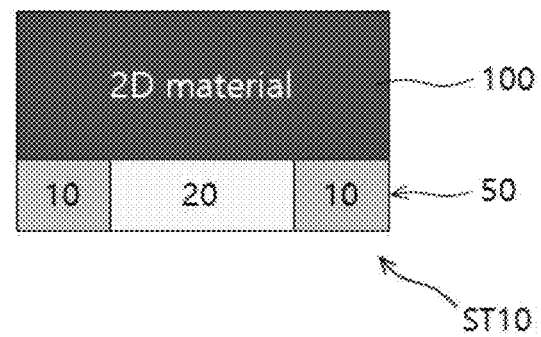
Figure 2C:
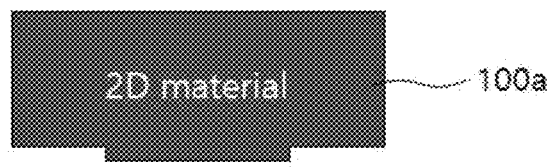
Figure 2C:
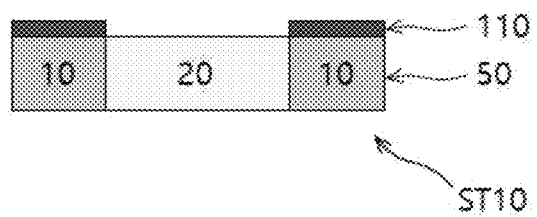

Referring to FIG. 2C, the crystalline material member 100 and the adhesion target layer 50 may be separated so that a 2D material layer pattern 110 separated (exfoliated/split/peeled) from the crystalline material member 100 may be formed on the surface of the adhesion target bonding layer 50. The crystalline material member 100 and the adhesion target layer 50 may be physically separated by an external force. A crystalline material member from which the 2D material layer pattern 110 is separated is indicated by reference number 100*a*.

A shape of the 2D material layer pattern 110 may be defined by at least two material layers constituting the adhesion target layer 50, in this case, the first and second material layers 10 and 20. According to an embodiment, the van der Waals bonding force between the first material layer 10 and the 2D material may be greater than the van der Waals bonding force between the plurality of unit layers present in the crystalline material member 100. The van der Waals bonding force between the second material layer 20 and the 2D material may be smaller than the van der Waals bonding force between the plurality of unit layers. Accordingly, a portion of the 2D material of the crystalline material member 100 may be selectively separated from the crystalline material member 100 and may be selectively transferred onto the first material layer 10. The 2D material portion coupled to the first material layer 10 may remain on the first material layer 10 after being separated from another 2D material portion adjacent thereto. On the other hand, since the 2D material portion bonded to the second material layer 20 is relatively weakly bonded to the second material layer 20 and has a relatively strong bonding force inside the crystalline material member 100, it may not be separated from the crystalline material member 100. Because of this reason, the shape of the 2D material layer pattern 110 may be defined by the first and second material layers 10 and 20. In this embodiment, the 2D material layer pattern 110 may be formed on the first material layer 10 instead of the second material layer 20. Patterning of such a 2D material may be mechanical patterning implemented according to a physical force, and may be performed through a dry process. Patterning of the 2D material may have excellent precision capable of controlling pattern edges at the nanometer level.

The van der Waals bonding force of the first and second material layers 10 and 20 for the 2D material may be regarded as a kind of adhesive force. The van der Waals bonding force may be controlled by the type of a material, a surface roughness, and the like. Accordingly, the above-described patterning of the 2D material may be easily performed by selecting appropriate materials for the first and second material layers 10 and 20 and, if necessary, controlling the surface roughness thereof. In addition, in some cases, the first and second material layers 10 and 20 are made of the same or similar material types, and it may be possible to control the van der Waals bonding force by controlling the surface roughness of the first and second material layers 10 and 20 differently.

The 2D material layer pattern 110 may be a monolayer (i.e., unit layer) of a 2D material or may have a structure in which the monolayer (i.e., unit layer) is stacked a plurality of times. Even if a monolayer (i.e., unit layer) of the 2D material is stacked a plurality of times, the properties of the 2D material may be maintained in terms of quantum mechanics. Accordingly, even when the 2D material layer pattern 110 has a structure in which the monolayer (i.e., unit layer) is stacked a plurality of times, it may be referred to as a '2D material'. In the 2D material layer pattern 110, the monolayer may be stacked several to several tens of times.

Figure 2D:
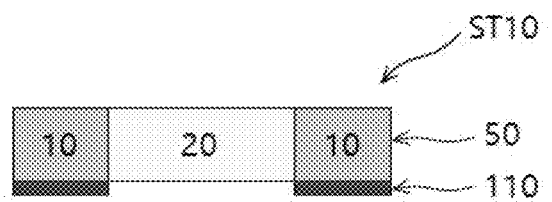
Figure 2E:
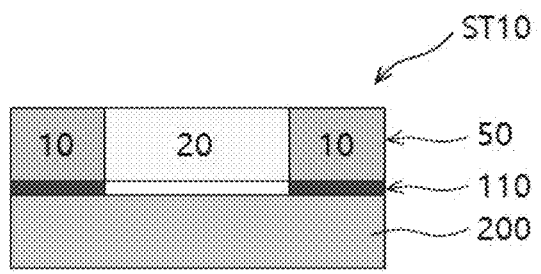
Figure 2F:
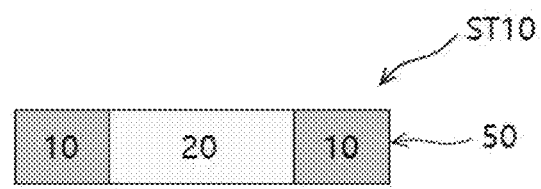

Referring to FIGS. 2D to 2F, a step for transferring the 2D material layer pattern 110 formed on the surface of the adhesion target layer 50 from the adhesion target layer 50 to a separate adhesion target substrate 200 may be additionally performed.

A van der Waals bond may be formed between the adhesion target substrate 200 and the 2D material layer pattern 110 by attaching the 2D material layer pattern 110 to the surface of the adhesion target substrate 200 (FIG. 2E). In this case, an intimate interface may be formed between the adhesion target substrate 200 and the 2D material layer pattern 110 through appropriate pressure application. The van der Waals bonding force between the adhesion target substrate 200 and the 2D material may be greater than the van der Waals bonding force between the adhesion target layer 50 and the 2D material. The van der Waals bonding force between the adhesion target substrate 200 and the 2D material layer pattern 110 may be greater than the van der Waals bonding force between the first material layer 10 and the 2D material layer pattern 110. Therefore, when the adhesion target substrate 200 and the adhesion target layer 50 are physically separated, the 2D material layer pattern 110 may remain on the adhesion target substrate 200 (FIG. 2F). That is, the 2D material layer pattern 110 may be transferred to the adhesion target substrate 200. The adhesion target substrate 200 may be made of a material different from that of the first material layer 10 and the second material layer 20. Alternatively, the surface roughness of the adhesion target substrate 200 may be different at least from the surface roughness of the first material layer 10. The adhesion target substrate 200 may be a substrate structure, but may also be a kind of layer or thin film.

In an embodiment of the present invention, the 2D material may be selectively separated and transferred according to the absolute and relative magnitudes of the van der Waals (vdW) bonding force between the 2D material and the adhesion target material. Accordingly, the 2D material may be patterned and transferred by using a non-chemical physical method. In this regard, according to an embodiment of the present invention, contamination or damage to a 2D material may be prevented or minimized, and patterning and transfer may be easily and precisely performed.

According to one embodiment of the present invention, the 2D material applied to the 2D material layer pattern 110 may include, for example, one of a 2D perovskite material and a transition metal dichalcogenide (TMD) material. The 2D perovskite material may include $PEA_2MA_2Pb_3I_{10}$ and the like as a non-limiting example. The TMD material may include various well-known TMDs. The 2D perovskite material and TMD material may be 2D semiconductor materials. However, the 2D material applied to the 2D material layer pattern 110 is not limited to the 2D perovskite material and the TMD material, and other 2D materials may be applied. For example, other 2D materials such as graphene or hexagonal boron nitride (h-BN) may also be applied to the embodiments of the present invention. This may be the same in other embodiments to be described below.

Although the expression, "van der Waals bond" or "van der Waals bonding force" is used in the above description, "van der Waals bond" is exemplary, and in some cases, "van der Waals bond" may be changed into any other bond or adhesion. This may be applied throughout this specification.

Figure 3:
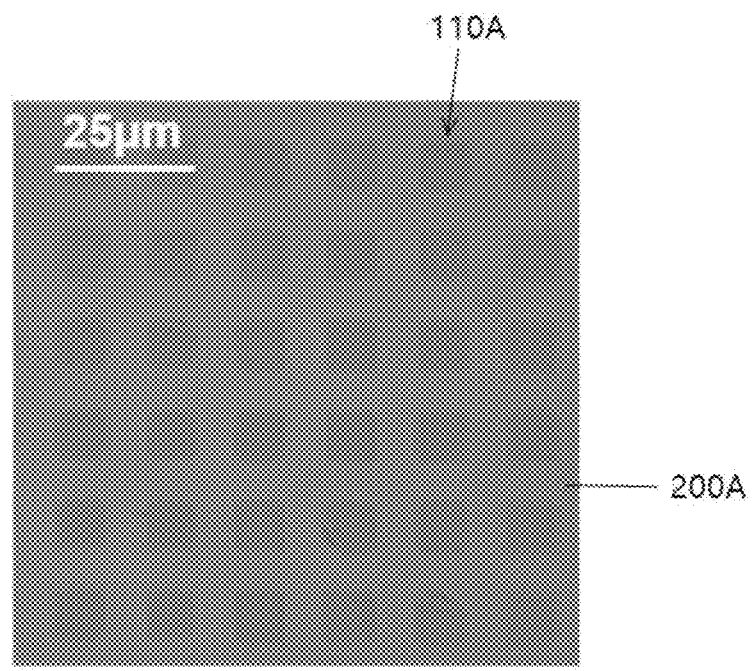
FIG. 3 is an optical microscope (OM) photographic image showing a 2D material layer pattern formed according to an embodiment of the present invention.

FIG. 3 is an optical microscope (OM) photographic image showing a 2D material layer pattern formed according to an embodiment of the present invention.

Referring to FIG. 3, a 2D material layer pattern 110A may be formed on an adhesion target substrate 200A. Here, the adhesion target substrate 200A may correspond to the adhesion target substrate 200 of FIG. 2F, and the 2D material layer pattern 110A may correspond to the 2D material layer pattern 110 of FIG. 2F. The adhesion target substrate 200A is a layer consisting of $MoO_3$, and the 2D material layer pattern 110A is a $PEA_2MA_2Pb_3I_{10}$ single layer (monolayer) pattern.

Figure 4:
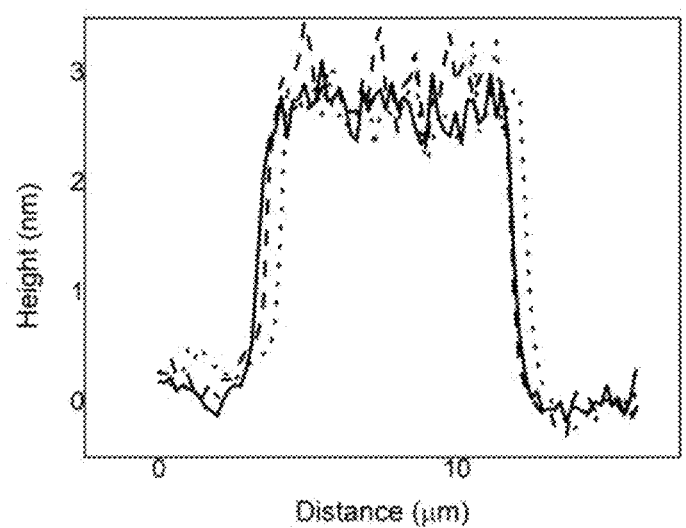
FIG. 4 is a graph showing an atomic force microscope (AFM) measurement result for one pixel of the 2D material layer pattern of FIG. 3.

FIG. 4 is a graph showing an atomic force microscope AFM) measurement result for one pixel of the 2D material layer pattern 110A of FIG. 3.

Referring to FIG. 4, it may be confirmed that the 2D material layer pattern 110A formed according to an embodiment of the present invention has excellent pattern shape and resolution.

Figure 5:
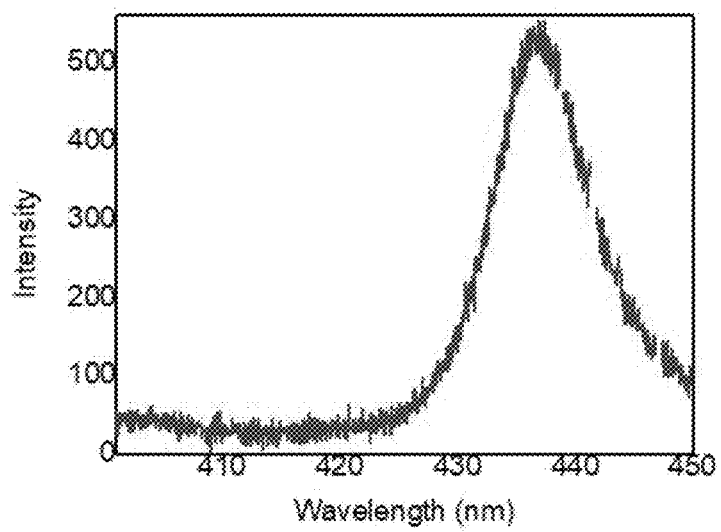
FIG. 5 is a graph showing a measuring result of photoluminescence (PL) characteristics of one pixel of the 2D material layer pattern of FIG. 3.

FIG. 5 is a graph showing a measuring result of photoluminescence (PL) characteristics of one pixel of the 2D material layer pattern 110A of FIG. 3.

Referring to FIG. 5, it may be confirmed that the $PEA_2MA_2Pb_3I_{10}$ single layer (pixel) corresponding to the pixel represents the optical characteristics of the semiconductor.

Figure 6A:
FIG. 6A to FIG. 6C are cross-sectional diagrams illustrating a selective separation and transfer method of a 2D material according to another embodiment of the present invention.
Figure 6B:
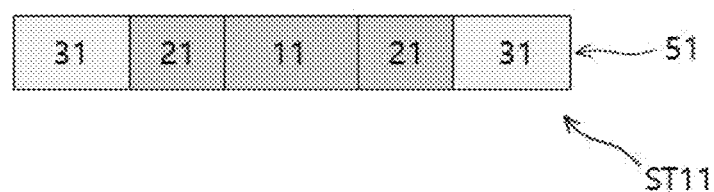
Figure 6C:
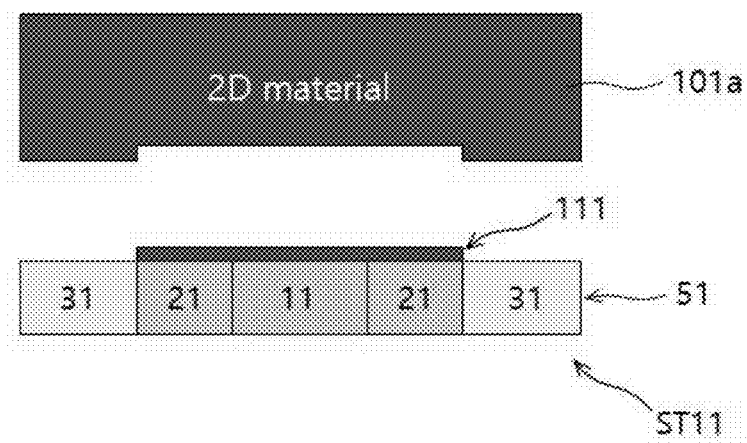

FIG. 6A to FIG. 6C are cross-sectional diagrams illustrating a selective separation and transfer method of a 2D material according to another embodiment of the present invention.

Referring to FIG. 6A, a substrate structure ST11 including an adhesion target layer 51 in which at least two different material layers 11, 21, and 31 are arranged to be in a lateral contact with each other may be provided. The substrate structure ST11 may be manufactured by using the method described in FIGS. 1A to 1G. Although not shown in FIG. 6A, a supporting layer (60 in FIG. 1G) may be provided under the adhesion target layer 51, and a handling layer (70 in FIG. 1G) disposed under the supporting layer may be further provided.

In this embodiment, the at least two material layers 11, 21, and 31 may include a first material layer 11, a second material layer 21 disposed on each of both sides of the first material layer 11, and a third material layer 31 disposed around at least the second material layer 21. A side surface of the second material layer 21 may be in contact with a side surface of the first material layer 11, and a side surface of the third material layer 31 may be in contact with a side surface of the second material layer 21. According to a non-limiting example, the first material layer 11 may be a first insulator, the second material layer 21 may be a conductor, and the third material layer 31 may be a second insulator. Also, at least two of the first to third material layers 11, 21, and 31 may have different surface roughness.

On the other hand, a crystalline material member 101 including a 2D material, wherein the 2D material constitutes a unit layer, and a plurality of the unit layers form a layered structure by van der Waals (vdW) bond may be provided. The crystalline material member 101 may be the same as or substantially same as the crystalline material member 100 described in FIG. 2A.

Referring to FIG. 6B, the crystalline material member 101 may be adhered to the surface of the adhesion target layer 51 so that a van der Waals bond may be formed between the crystalline material member 101 and the adhesion target layer 51. In other words, the surface of the crystalline material member 101 may be attached to the surface of the target layer 51 so that a van der Waals bond may be formed between the 2D material (a unit layer) of the crystalline material member 101 and the adhesion target layer 51. A process of this step may bee same as or similar to the process described in FIG. 2B. As a result of the process of FIG. 6B, a van der Waals bond may be formed between the first material layer 11 and the 2D material, a van der Waals bond may be formed between the second material layer 21 and the 2D material, and a van der Waals bond may be formed between the third material layer 31 and the 2D material.

Referring to FIG. 6C, the crystalline material member 101 and the target layer 51 may be separated from each other so that a 2D material layer pattern 111 separated (exfoliated/peeled) from the crystalline material member 101 may be formed on the surface of the adhesion target layer 51. The crystalline material member 101 and the adhesion target layer 51 may be physically separated by an external force. A crystalline material member from which the 2D material layer pattern 111 is separated is indicated by reference number 101a.

A shape of the 2D material layer pattern 111 may be defined by at least two material layers constituting the adhesion target layer 51, in this case, the first to third material layers 11, 21, and 31. According to an embodiment, the van der Waals bonding force between the first material layer 11 and the 2D material may be greater than the van der Waals bonding force between the plurality of unit layers present in the crystalline material member 101. The van der Waals bonding force between the second material layer 21 and the 2D material may be greater than the van der Waals bonding force between the plurality of unit layers present in the crystalline material member 101. Meanwhile, van der Waals bonding force between the third material layer 31 and the 2D material may be smaller than van der Waals bonding force between the plurality of unit layers. Accordingly, a portion of the 2D material of the crystalline material member 101 may be selectively separated from the crystalline material member 101 and may be selectively transferred onto the first and second material layers 11 and 21. The 2D material portion coupled to the first and second material layers 11 and 21 may be separated from another adjacent 2D material portion and remain on the first and second material layers 11 and 21. On the other hand, in the case of the 2D material portion bonded to the third material layer 31, since it is relatively weakly bonded to the third material layer 31 and has a relatively strong bonding force inside the crystalline material member 101, it may not be separated from the crystalline material member 101. Because of this reason, the shape of the 2D material layer pattern 111 may be defined by the first to third material layers 11, 21 and 31.

In this embodiment, the 2D material layer pattern 111 may be formed (remained) on the first and second material layers 11 and 21 instead of the third material layer 31. When the first material layer 11 is an insulator and the second material layer 21 is a conductor, in this embodiment, the 2D material layer pattern 111 may be a channel layer pattern interconnecting two second material layers 21 disposed on both sides of the first material layer 11. In this case, the 2D material layer pattern 111 may be a semiconductor.

In FIG. 6C, the adhesion target layer 51 and the 2D material layer pattern 111 formed thereon may be directly applied in order to manufacture a predetermined device. Therefore, a structure of at least a portion of the adhesion target layer 51 may be used as a component constituting the device. For example, the two second material layers 21 may be used as electrodes. In addition, although not shown in FIG. 6C, a supporting layer disposed on the lower surface of the bonding target layer 51 may also be used as a component constituting the device.

In an embodiment of the present invention, the 2D material layer pattern 111 may be a semiconductor or a conductor. Depending on whether the 2D material layer pattern 111 is a semiconductor or a conductor, different types of devices may be manufactured. In addition, a plurality of devices may be manufactured by regularly and repeatedly arranging a unit region in which the first to third material layers 11, 21, and 31.

Figure 7:
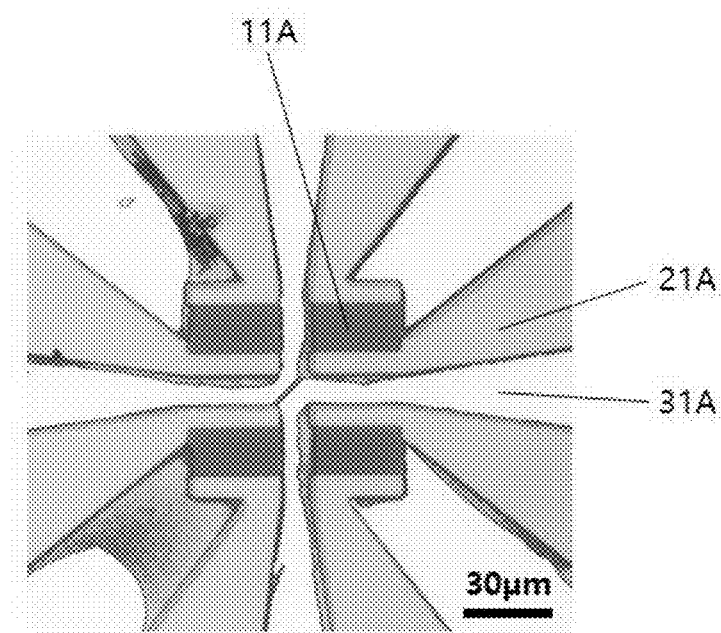
FIG. 7 is an optical microscope (OM) photographic image showing a planar structure of an adhesion target layer which may be applied to the selective separation and transfer method of a 2D material according to an embodiment of the present invention.

FIG. 7 is an optical microscope (OM) photographic image showing a planar structure of an adhesion target layer which may be applied to the selective separation and transfer method of a 2D material according to an embodiment of the present invention.

Referring to FIG. 7, an adhesion target layer may include a first material layer 11A, a second material layer 21A, and a third material layer 31A. Here, the first material layer 11A may correspond to the first material layer 11 of FIG. 6A, the second material layer 21A may correspond to the second material layer 21 of FIG. 6A, and the third material layer 31A may correspond to the third material layer 31 of FIG. 6A. In this embodiment, the first material layer 11A is a $MgF_2$ layer, the second material layer 21A is an Au layer, and the third material layer 31A is a $SiO_2$ layer. The structure of FIG. 7 may be a substrate structure for constituting a photosensor (photodetector) array in a 2×2 arrangement according to an embodiment of the present invention.

Figure 8:
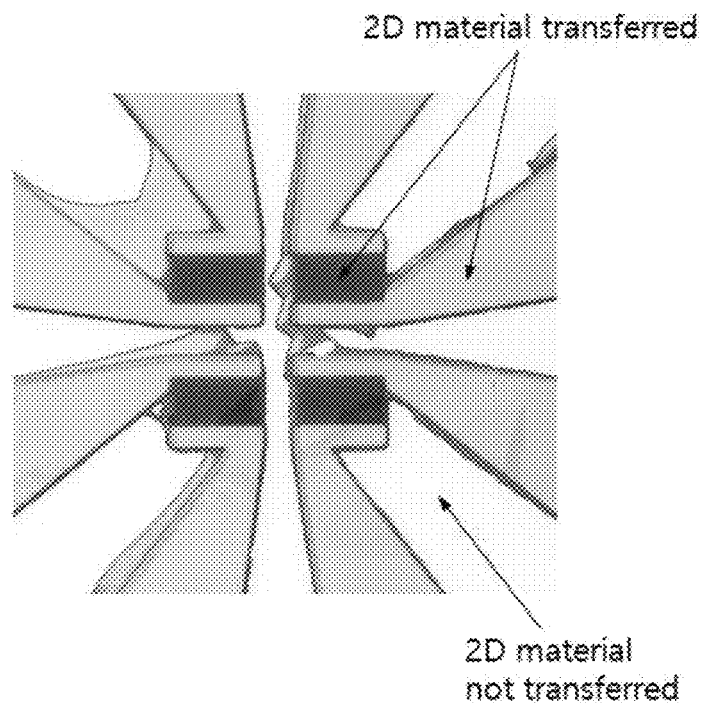
FIG. 8 is an optical microscope (OM) photographic image showing a 2D material layer pattern transferred on the adhesion target layer of FIG. 7 according to an embodiment of the present invention.

FIG. 8 is an optical microscope (OM) photographic image showing a 2D material layer pattern transferred on the adhesion target layer of FIG. 7 according to an embodiment of the present invention.

Referring to FIG. 8, a 2D material may be transferred on the first and second material layers (11A and 21A in FIG. 7), and a 2D material may not be transferred on the third material layer (31A in FIG. 7). Accordingly, the 2D material layer pattern in FIG. 8 may have the form of the 2D material layer pattern 111 as described in FIG. 6C. In FIG. 8, the 2D material layer pattern is a $PEA_2MA_2Pb_3I_{10}$ single layer (monolayer) pattern. In this case, the 2D material layer pattern may function as a channel layer interconnecting two second material layers (21A in FIG. 7).

Figure 9:
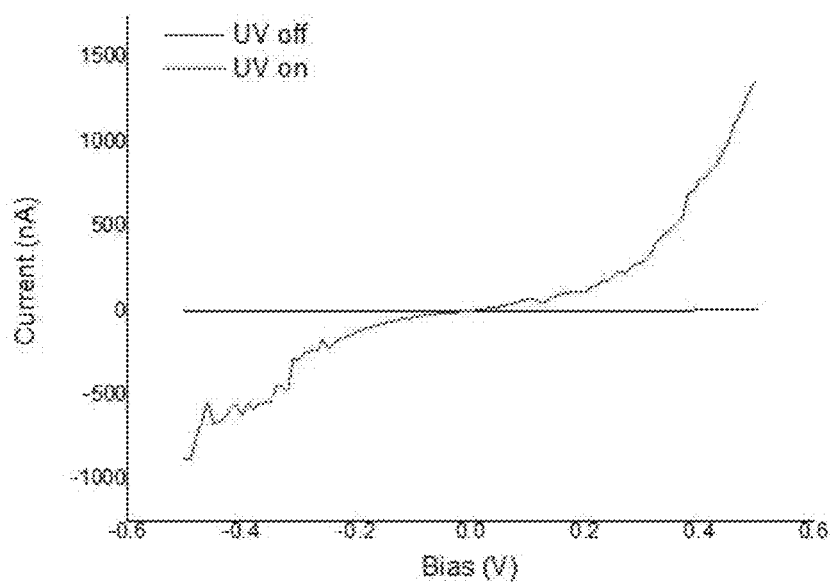
FIG. 9 is a graph showing driving characteristics of an optical sensor (photodetector) device having the structure of FIG. 8 to which a 2D material is applied.

FIG. 9 is a graph showing driving characteristics of an optical sensor (photodetector) device having the structure of FIG. 8 to which a 2D material is applied.

Referring to FIG. 9, an optical sensor (photodetector) device to which a 2D material manufactured according to an embodiment of the present invention is applied may exhibit driving characteristics in which a photocurrent is changed by UV ray irradiation.

FIG. 10A to FIG. 10F are cross-sectional diagrams illustrating a selective separation and transfer method of a 2D material according to another embodiment of the present invention.

Figure 10A:
FIG. 10A to FIG. 10F are cross-sectional diagrams illustrating a selective separation and transfer method of a 2D material according to another embodiment of the present invention.

Referring to FIG. 10A, a substrate structure ST12 including an adhesion target layer 52 in which at least two different material layers 12 and 22 are arranged in a lateral contact may be provided. The substrate structure ST12 may be manufactured by using the method described in FIGS. 1A to 1G. Although not shown in FIG. 10A, a supporting layer (60 in FIG. 1G) may be provided under the adhesion target layer 52, and a handling layer (70 in FIG. 1G) disposed under the supporting layer may be further provided.

In addition, a crystalline material member 102 including a 2D material, wherein the 2D material constitutes a unit layer, and a plurality of the unit layers form a layered structure by van der Waals (vdW) bond may provide. The crystalline material member 102 may be same or substantially same as the crystalline material member 100 described in FIG. 2A.

Figure 10B:
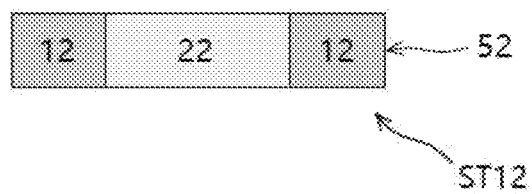

Referring to FIG. 10B, the crystalline material member 102 may be attached to the surface of the adhesion target layer 52 so that a van der Waals bond may be formed between the crystalline material member 102 and the adhesion target layer 52. In other words, the surface of the crystalline material member 102 may be attached to the surface of the bonding target layer 52 so that a van der Waals bond may be formed between the 2D material (a unit layer) of the crystalline material member 102 and the bonding target layer 52. A process of this step may be the same as or similar to the process described in FIG. 2B. As a result of the process of FIG. 10B, a van der Waals bond may be formed between the first material layer 12 and the 2D material, and a van der Waals bond may be formed between the second material layer 22 and the 2D material.

Figure 10C:
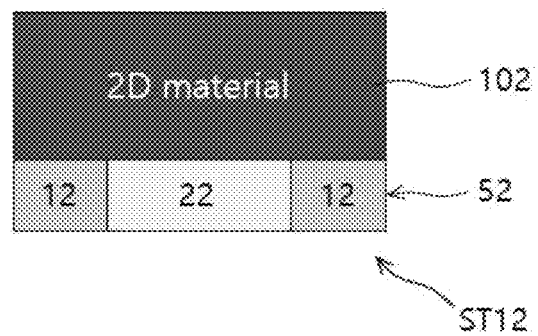

Referring to FIG. 10C, the crystalline material member 102 and the target layer 52 may be separated from each other so that the 2D material layer 112 separated (exfoliated/peeled) from the crystalline material member 102 remains on the surface of the target bonding layer 52. The crystalline material member 102 and the adhesion target layer 52 may be physically separated by an external force. A crystalline material member from which the 2D material layer 112 is separated is indicated by reference numeral 102a.

In this embodiment, the van der Waals bonding force between the first material layer 12 and the 2D material may be greater than the van der Waals bonding force between the plurality of unit layers present in the crystalline material member 102. Also, van der Waals bonding force between the second material layer 22 and the 2D material may be greater than van der Waals bonding force between the plurality of unit layers. Thus, the 2D material layer 112 may remain on the first and second material layers 12 and 22. The first and second material layers 12 and 22 may be made of different materials. The first and second material layers 12 and 22 may have different surface roughness.

Figure 10D:
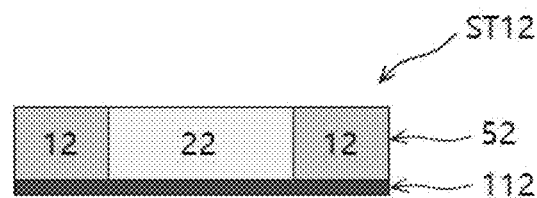
Figure 10E:
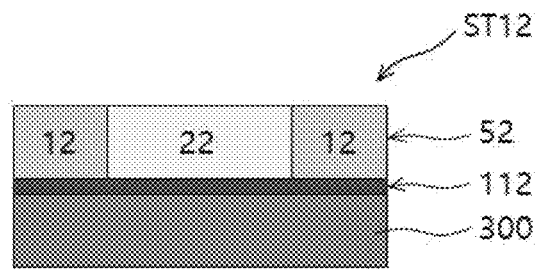

Referring to FIGS. 10D and 10E, the 2D material layer 112 disposed on the surface of the adhesion target layer 52 may be adhered to a surface of an adhesion target substrate 300. A van der Waals bond may be formed between the adhesion target substrate 300 and the 2D material layer 112 by attaching the 2D material layer 112 to the surface of the adhesion target substrate 300. In this case, an intimate interface may be formed between the adhesion target substrate 300 and the 2D material layer 112 by applying an appropriate pressure.

Figure 10F:
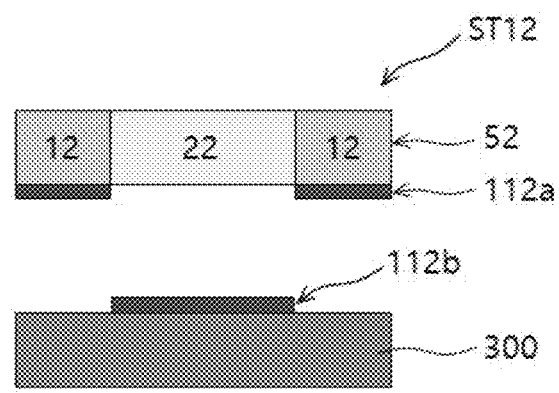

Referring to FIG. 10F, the target bonding layer 52 and the substrate 300 may be separated from each other so that a 2D material layer pattern 112b separated as a pattern form from the 2D material layer 112 may remain on the surface of the adhesion target substrate 300. A shape of the 2D material layer pattern 112b may be defined by the at least two material layers 12 and 22 and the adhesion target substrate 300. The 2D material layer from which the 2D material layer pattern 112b is separated is indicated by reference number 112a.

In this embodiment, the van der Waals bonding force between the first material layer 12 and the 2D material may be greater than the van der Waals bonding force between the adhesion target substrate 300 and the 2D material. That is, the van der Waals bonding force between the first material layer 12 and the 2D material layer 112 may be greater than the van der Waals bonding force between the adhesion target substrate 300 and the 2D material layer 112. Meanwhile, the van der Waals bonding force between the second material layer 22 and the 2D material may be smaller than the van der Waals bonding force between the adhesion target substrate 300 and the 2D material. That is, the van der Waals bonding force between the second material layer 22 and the 2D material layer 112 may be smaller than the van der Waals bonding force between the adhesion target substrate 300 and the 2D material layer 112. Accordingly, the 2D material layer pattern 112b may remain on the area corresponding to the second material layer 22 in the adhesion target substrate 300. In other words, a portion of the 2D material layer 112 may be selectively separated and transferred to the adhesion target substrate 300.

The adhesion target substrate 300 may be made of a material different from at least one of the first and second material layers 12 and 22. The surface roughness of the adhesion target substrate 300 may be different from the surface roughness of at least one of the first and second material layers 12 and 22. The first and second material layers 12 and 22 may have different surface roughness. The adhesion target substrate 300 may be a substrate structure, but may also be a kind of layer or thin film.

Figure 11A:
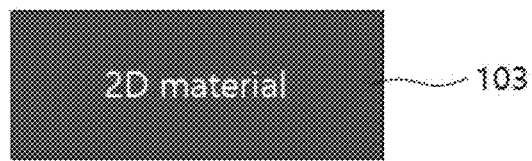
FIG. 11A to FIG. 11C are cross-sectional diagrams illustrating a selective separation and transfer method of a 2D material according to another embodiment of the present invention.
Figure 11B:
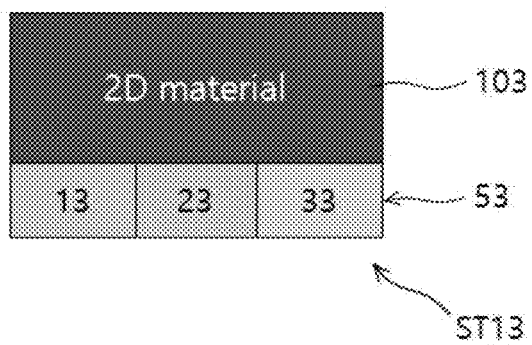
Figure 11C:
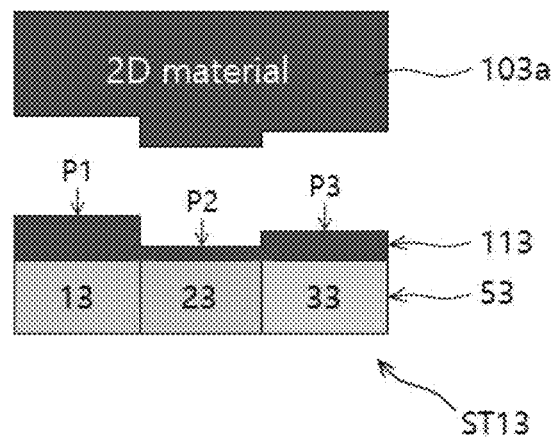

FIG. 11A to FIG. 11C are cross-sectional diagrams illustrating a selective separation and transfer method of a 2D material according to another embodiment of the present invention.

Referring to FIG. 11A, a substrate structure ST13 including an adhesion target layer 53 in which at least two different material layers 13, 23, and 33 are arranged to be in contact with each other laterally may be prepared. The substrate structure ST13 may be manufactured by using the method described in FIGS. 1A to 1G. For example, at least two material layers 13, 23, and 33 may include a first material layer 13, a second material layer 23, and a third material layer 33. A side surface of the second material layer 23 may be in contact with a side surface of the first material layer 13, and a side surface of the third material layer 33 may be in contact with a side surface of the second material layer 23. At least two of the first to third material layers 13, 23, and 33 may have different surface roughness. Although not shown in FIG. 11A, a supporting layer (60 in FIG. 1G) may be provided under the adhesion layer 53, and a handling layer (70 in FIG. 1G) disposed under the supporting layer may be further provided.

In addition, a crystalline material member 103 including a 2D material, wherein the 2D material constitutes a unit layer, and a plurality of the unit layers form a layered structure by van der Waals (vdW) bonding may be provided. The crystalline material member 103 may be the same as or be substantially same as the crystalline material member 100 described in FIG. 2A.

Referring to FIG. 11B, the crystalline material member 103 may be adhered to the surface of the adhesion target layer 53 so that a van der Waals bond may be formed between the crystalline material member 103 and the adhesion target layer 53. In other words, the surface of the crystalline material member 103 may be attached to the surface of the bonding target layer 53 so that a van der Waals bond may be formed between the 2D material (a unit layer) of the crystalline material member 103 and the bonding target layer 53. A process of this step may be the same as or similar to the process described in FIG. 2B. As a result of the process of FIG. 11B, a van der Waals bond may be formed between the first material layer 13 and the 2D material, a van der Waals bond may be formed between the second material layer 23 and the 2D material, and a van der Waals bond may be formed between the third material layer 33 and the 2D material.

Referring to FIG. 11C, the crystalline material member 103 and the target layer 53 may be separated from each other so that a 2D material layer 113 separated (exfoliated/peeled) from the crystalline material member 103 may remain on the surface of the target bonding layer 53. The crystalline material member 103 and the adhesion target layer 53 may be physically separated by an external force. A crystalline material member from which the 2D material layer 113 is separated is indicated by reference number 103a.

In this embodiment, the 2D material layer 113 may have different thicknesses on at least two material layers 13, 23, and 33 included in the adhesion target layer 53. By using the difference of bonding force (adhesive force) and interaction between the first to third material layers 13, 23, and 33 and the 2D material, thickness of the 2D material transferred to each material layer 13, 23, and 33 may be made different. According to an example, the 2D material layer 113 may include a first portion P1 disposed on the first material layer 13 and a second portion P2 disposed on the second material layer 23. The first portion P1 may have a first thickness, and the second portion P2 may have a second thickness different from the first thickness. In addition, the 2D material layer 113 may further include a third portion P3 disposed on the third material layer 33, and the third portion P3 has a third thickness different from the first thickness and the second thickness. The first to third portions P1, P2, and P3 may include 2D materials of different numbers of layers. In the case of a 2D material, since new physical properties may be expressed or intrinsic physical properties may be adjusted according to the thickness in the nanometer level thickness range, if the 2D material layer 113 transferred to different thicknesses for each area is used, it is possible to diversify the functions of 2D material-based devices. The 2D material layer 113 may be regarded as a kind of pattern. Accordingly, the 2D material layer 113 may also be referred to as a 2D material layer pattern.

Figure 12:
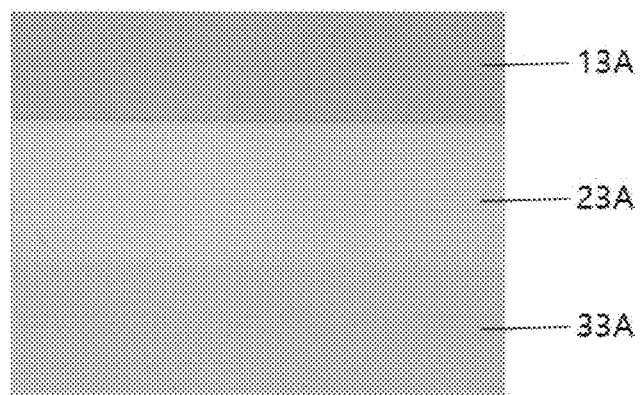
FIG. 12 is an optical microscope (OM) photographic image showing a planar structure of an adhesion target layer applicable to the selective separation and transfer method of a 2D material according to an embodiment of the present invention.

FIG. 12 is an optical microscope (OM) photographic image showing a planar structure of an adhesion target layer applicable to the selective separation and transfer method of a 2D material according to an embodiment of the present invention.

Referring to FIG. 12, an adhesion target layer may include a first material layer 13A, a second material layer 23A, and a third material layer 33A. Here, the first material layer 13A may correspond to the first material layer 13 of FIG. 11A, the second material layer 23A may correspond to the second material layer 23 o FIG. 11A, and the third material layer 33A may correspond to the third material layer 33 of FIG. 11A. In this embodiment, the first material layer 13A is an Au layer, the second material layer 23A is an Ag layer, and the third material layer 33A is a Ni layer.

Figure 13:
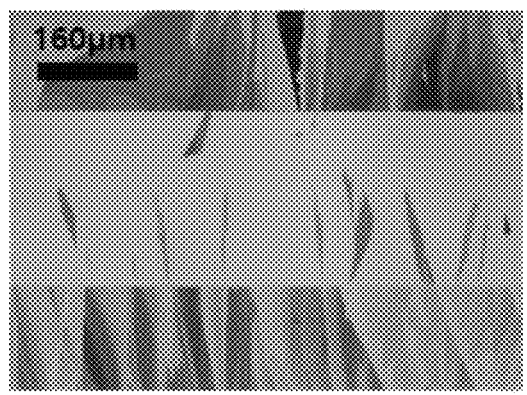
FIG. 13 is an optical microscope (OM) photographic image showing a 2D material layer transferred on the adhesion target layer of FIG. 12 according to an embodiment of the present invention.

FIG. 13 is an optical microscope (OM) photographic image showing a 2D material layer transferred on the adhesion target layer of FIG. 12 according to an embodiment of the present invention.

Referring to FIG. 13, 2D materials may be transferred onto the first to third material layers (13A, 23A, and 33A in FIG. 12), but may be transferred so that they may have different thicknesses for each material layer area. In FIG. 13, the 2D material is $PEA_2MA_2Pb_3I_{10}$.

FIG. 14A to FIG. 14F are cross-sectional diagrams illustrating a selective separation and transfer method of a 2D material according to another embodiment of the present invention.

Figure 14A:
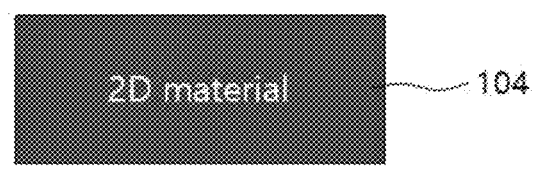
FIG. 14A to FIG. 14F are cross-sectional diagrams illustrating a selective separation and transfer method of a 2D material according to another embodiment of the present invention.
Figure 14A:

Referring to FIG. 14A, a substrate structure ST14 including an adhesion target layer 54 may be provided. In addition, it is possible to provide a crystalline material member 104 including a 2D material, wherein the 2D material constitutes a unit layer, and a plurality of the unit layers form a layered structure by van der Waals (vdW) bonding.

Figure 14B:
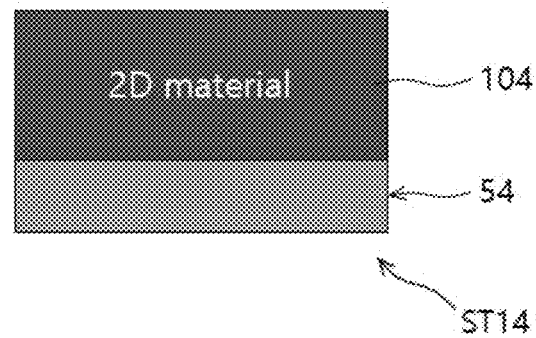
Figure 14C:
Figure 14C:

Referring to FIGS. 14B and 14C, the crystalline material member 104 is bonded to and separated from the bonding target layer 54 by using a method which is the same as or similar to that applied to the above-described embodiments, and thus, the 2D material of the crystalline material member 104 may be transferred to the surface of the adhesion target layer 54. As a result, a 2D material layer 114 may be formed on the surface of the adhesion target layer 54. A crystalline material member from which the 2D material layer 114 is separated is indicated by reference numeral 104a (FIG. 14C). The 2D material layer 114 may have a predetermined pattern shape.

The result (intermediate result) of FIG. 14C, that is, the result (intermediate result) composed of the adhesion target layer 54 and the 2D material layer 114 disposed thereon is only exemplary, and as the result (intermediate result), the result of FIG. 2C or the result of FIG. 2F may be applied. Also, as the result (intermediate result), the result of FIG. 6C, the result of FIG. 10F, or the result of FIG. 11C may be applied.

Figure 14D:
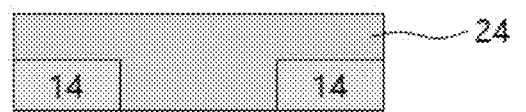
Figure 14D:

Referring to FIG. 14D, a structure including a plurality of member layers 14 and a support element layer 24 physically holding and supporting the plurality of member layers 14 may be provided. The plurality of member layers 14 may be disposed spaced apart from each other, and may be disposed such that one side thereof may be exposed toward the 2D material layer 114.

Figure 14E:
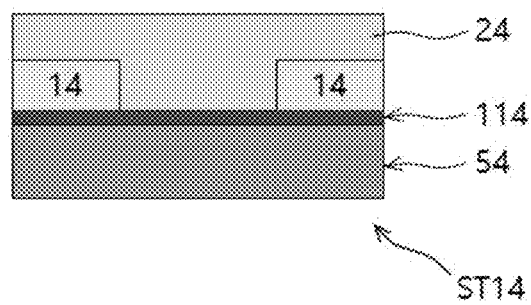

Referring to FIG. 14E, the structure including the plurality of member layers 14 and the support element layer 24 may be stacked on the 2D material layer 114. One surface of the plurality of member layers 14 may be in contact with the 2D material layer 114.

Figure 14F:
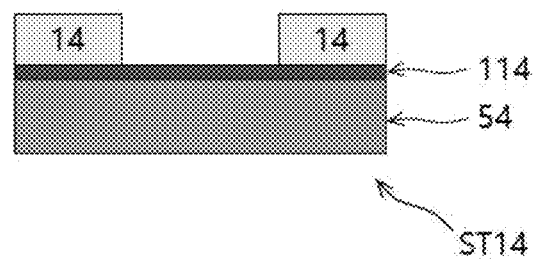

Referring to FIG. 14F, the support element layer (24 in FIG. 14E) may be removed. The support element layer 24 may be removed by a physical removal method or a chemical removal method. A predetermined etching method may be applied to the removal of the support element layer 24. The plurality of member layers 14 may be, for example, electrodes which are components of a device. For example, one of the plurality of member layers 14 may be a first electrode, and the other may be a second electrode. However, the plurality of member layers 14 may be other members other than electrodes. The structure of FIG. 14F may be a kind of device structure. Accordingly, the method of FIGS. 14A to 14F may be referred to as a method of fabricating a device to which a 2D material is applied.

Furthermore, although the expression "van der Waals bond" or "van der Waals bonding force" is used in the above description, "van der Waals bond" is exemplary, and in some cases, "van der Waals bond" may be changed to another arbitrary coupling or combination or adhesion. For example, depending on a subsequent process, a van der Waals bond may be changed into another bond.

A method of fabricating a device to which a 2D material is applied according to an embodiment of the present invention may include forming a 2D material layer pattern by using the method according to the above-described embodiments of the present invention and forming a device including the 2D material layer pattern. The forming the device may include, for example, forming an electrode structure electrically connected to the 2D material layer pattern. The device may include any one of a semiconductor device, a display device, a solar cell device, and a sensor device. The semiconductor device may include a switching device such as a transistor. Also, the semiconductor device may be a memory device or a non-memory device. Furthermore, the semiconductor device may be a non-optical device or an optical device.

According to the embodiments of the present invention described above, it is possible to implement a 'method of selective separation and transfer of a 2D material' capable of easily forming a 2D material layer pattern while minimizing the effect on the physical/chemical properties of the 2D material without problems such as damage, contamination, residue generation, and etc. for the 2D material by using the difference in bonding force between materials. In addition, according to embodiments of the present invention, a 'method for selective separation and transfer of a 2D material' capable of precisely patterning a 2D material and easily controlling a shape, a position, a thickness, and etc. of the 2D material pattern may be implemented. In addition, according to the embodiments of the present invention, it is possible to implement a 'method of selective separation and transfer of a 2D material' which may be easily applied even to 2D materials vulnerable to exposure to external environments and chemicals due to the characteristics of a dry process.

According to embodiments of the present invention, since the bonding force between materials may be controlled in a wide range by controlling the material composition and surface roughness of the adhesion target layer according to a region, the application scope of the above 'method of selective separation and transfer of a 2D material' may be expanded to various 2D materials. In addition, the 'method of selective separation and transfer of a 2D material' according to embodiments of the present invention may be applied to a 4-inch or larger wafer and may be used as a large-area process.

When using the method of selective separation and transfer of a 2D material according to embodiments of the present invention, various devices having excellent performance may be easily manufactured. In addition, according to one embodiment, since various materials and manufacturing methods may be applied to the adhesion target layer and the supporting layer, there is an advantage that the result of the above selective separation and transfer may be directly applied to a manufacturing process of a thin film device by applying the material and the structure constituting the thin film device to the adhesion target layer and the supporting layer.

In this specification, the preferred embodiments of the present invention have been disclosed, and although specific terms have been used, they are only used in a general sense to easily explain the technical content of the present invention and to help understanding the present invention, and they are not used to limit the scope of the present invention. It is apparent to those having ordinary skill in the related art to which the present invention belong that other modifications based on the technical idea of the present invention may be implemented in addition to the embodiments disclosed herein. It will be understood to those having ordinary skill in the related art that in connection with the method of selective separation and transfer of a 2D material according to the embodiment described with reference to FIGS. 1A to 14F, and the manufacturing method of the device using the same, various substitutions, changes, and modifications may be made without departing from the technical spirit of the present invention. Therefore, the scope of the invention should not be determined by the described embodiments, but should be determined by the technical concepts described in the claims.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of selective separation and transfer of a 2D material, comprising:
   preparing a substrate structure including an adhesion target layer in which at least two different material layers are arranged to be in contact with each other laterally;
   preparing a crystalline material member including a 2D material, wherein the 2D material constitutes a unit layer, and a plurality of the unit layers form a layered structure through bonding;
   adhering the crystalline material member to a surface of the adhesion target layer so that a bond is formed between the crystalline material member and the adhesion target layer; and
   separating the crystalline material member and the adhesion target layer so that a 2D material layer pattern separated from the crystalline material member is formed on the surface of the adhesion target layer,
   wherein a shape of the 2D material layer pattern is defined by the at least two material layers.

2. The method of selective separation and transfer of a 2D material of claim 1, wherein the preparing the substrate structure includes:
   forming the adhesion target layer having a desired pattern shape on a base substrate;
   forming a supporting layer on the adhesion target layer;
   forming a handling layer on the supporting layer; and
   separating a stack structure including the adhesion target layer, the supporting layer, and the handling layer from the base substrate.

3. The method of selective separation and transfer of a 2D material of claim 1,
   wherein the at least two material layers includes a first material layer and a second material layer,
   a bonding force between the first material layer and the 2D material is greater than a bonding force between the plurality of unit layers,
   a bonding force between the second material layer and the 2D material is smaller than the bonding force between the plurality of unit layers,
   wherein the 2D material layer pattern is formed on the first material layer instead of the second material layer.

4. The method of selective separation and transfer of a 2D material of claim 1, wherein the at least two material layers includes a first material layer and a second material layer, and the first material layer and the second material layer have different surface roughness.

5. The method of selective separation and transfer of a 2D material of claim 1, wherein the at least two material layers include a first material layer and a second material layer,
wherein the first material layer is any one of a conductor, a semiconductor and an insulator,
wherein the second material layer is any one of a conductor, a semiconductor and an insulator.

6. The method of selective separation and transfer of a 2D material of claim 1, further comprising transferring the 2D material layer pattern formed on the surface of the adhesion target layer to a separate adhesion target substrate from the adhesion target layer, and wherein a bonding force between the adhesion target substrate and the 2D material is greater than a bonding force between the adhesion target layer and the 2D material.

7. The method of selective separation and transfer of a 2D material of claim 1,
wherein the at least two material layers includes a first material layer, a second material layer disposed on each of both sides of the first material layer, and a third material layer disposed around at least the second material layer,
wherein the 2D material layer pattern is formed on the first and second material layers instead of the third material layer.

8. The method of selective separation and transfer of a 2D material of claim 7,
wherein the first material layer is a first insulator,
wherein the second material layer is a conductor,
wherein the third material layer is a second insulator.

9. The method of selective separation and transfer of a 2D material of claim 7, wherein the 2D material layer pattern is a channel layer pattern interconnecting the two second material layers disposed on both sides of the first material layer.

10. The method of selective separation and transfer of a 2D material of claim 1, wherein the 2D material includes one of a 2D perovskite material and a transition metal dichalcogenide (TMD) material.

11. A method for selective separation and transfer of a 2D material, comprising:
preparing a substrate structure including an adhesion target layer in which at least two different material layers are arranged to be in contact with each other laterally;
preparing a crystalline material member including a 2D material, wherein the 2D material constitutes a unit layer, and a plurality of the unit layers form a layered structure through bonding;
adhering the crystalline material member to a surface of the adhesion target layer so that a bond is formed between the crystalline material member and the adhesion target layer;
separating the crystalline material member and the adhesion target layer so that the 2D material layer separated from the crystalline material member remains on the surface of the adhesion target layer;
adhering the 2D material layer disposed on the surface of the adhesion target layer to a surface of the adhesion target substrate; and
separating the adhesion target layer and the adhesion target substrate so that a 2D material layer pattern separated from the 2D material layer in a pattern form remains on the surface of the adhesion target substrate,
wherein a shape of the 2D material layer pattern is defined by the at least two material layers and the adhesion target substrate.

12. The method for selective separation and transfer of a 2D material of claim 11,
wherein the at least two material layers include a first material layer and a second material layer,
a bonding force between the first material layer and the 2D material is greater than a bonding force between the plurality of unit layers,
a bonding force between the second material layer and the 2D material is greater than the bonding force between the plurality of unit layers,
wherein the 2D material layer remains on the first and second material layers.

13. The method for selective separation and transfer of a 2D material of claim 12,
wherein the bonding force between the first material layer and the 2D material is greater than a bonding force between the adhesion target substrate and the 2D material,
wherein the bonding force between the second material layer and the 2D material is smaller than the bonding force between the adhesion target substrate and 2D material,
wherein the 2D material layer pattern remains on a region corresponding to the second material layer on the adhesion target substrate.

14. The method for selective separation and transfer of a 2D material of claim 12,
wherein the at least two material layers include first material layer and the second material layer,
wherein the first material layer and second material layer have different surface roughness.

15. A method for selective separation and transfer of a 2D material, comprising:
preparing a substrate structure including an adhesion target layer in which at least two different material layers are arranged to be in contact with each other laterally;
preparing a crystalline material member including a 2D material, wherein the 2D material constitutes a unit layer, and a plurality of the unit layers form a layered structure through bonding;
adhering the crystalline material member to a surface of the adhesion target layer so that a bond is formed between the crystalline material member and the adhesion target layer; and
separating the crystalline material member and the adhesion target layer so that the 2D material layer separated from the crystalline material member remains on the surface of the adhesion target layer,
wherein the 2D material layer has a different thickness on the at least two material layers.

16. The method for selective separation and transfer of a 2D material of claim 15,
wherein the at least two material layers include a first material layer and a second material layer,
wherein the 2D material layer includes a first portion disposed on the first material layer and a second portion disposed on the second material layer,
wherein the first portion has a first thickness, and the second portion has a second thickness different from the first thickness.

17. The method for selective separation and transfer of a 2D material of claim 16,
wherein the at least two material layers further includes a third material layer,
wherein the 2D material layer further includes a third portion disposed on the third material layer, and the third portion has a third thickness different from the first and second thicknesses.

18. The method for selective separation and transfer of a 2D material of claim 15, wherein the at least two material layers includes a first material layer and a second material layer, and the first material layer and second material layer has different surface roughness.

19. A method of fabricating a device to which a 2D material is applied, comprising:
   forming a 2D material layer pattern by using the method of claim 1; and
   forming a device including the 2D material layer pattern.

20. The method of fabricating a device to which a 2D material is applied according to claim 19, wherein the device includes any one of a semiconductor device, a display device, a solar cell device, and a sensor device.

* * * * *